US012584947B2

(12) United States Patent
Zucker et al.

(10) Patent No.: US 12,584,947 B2
(45) Date of Patent: Mar. 24, 2026

(54) DIFFERENTIAL DUAL SENSOR CONTACTLESS MAGNETIC-MODE ELECTRICAL CURRENT SENSORS WITH TAMPER DETECTION

(71) Applicant: Spindrift Innovations, LLC, Redwood City, CA (US)

(72) Inventors: Robert D. Zucker, Half Moon Bay, CA (US); Robert P. Weber, Redwood City, CA (US)

(73) Assignee: Spindrift Innovations, LLC, Redwood City, CA (US)

( * ) Notice: Subject to any disclaimer, the term of this patent is extended or adjusted under 35 U.S.C. 154(b) by 0 days.

(21) Appl. No.: 19/085,728

(22) Filed: Mar. 20, 2025

(65) Prior Publication Data

US 2025/0277829 A1     Sep. 4, 2025

Related U.S. Application Data

(63) Continuation-in-part of application No. 18/935,528, filed on Nov. 2, 2024.

(Continued)

(51) Int. Cl.
*G01R 15/20* (2006.01)
*G01R 19/165* (2006.01)
*G01R 21/00* (2006.01)

(52) U.S. Cl.
CPC ........... *G01R 21/007* (2013.01); *G01R 15/20* (2013.01); *G01R 19/16533* (2013.01)

(58) Field of Classification Search
CPC . G01R 21/007; G01R 15/20; G01R 19/16533
See application file for complete search history.

(56) References Cited

U.S. PATENT DOCUMENTS 4,707,679 A     11/1987     Kennon et al.
4,804,957 A     2/1989     Selph et al.
(Continued)

FOREIGN PATENT DOCUMENTS

CN     202189673 U     4/2012
CN     104316739 A     1/2015
(Continued)

OTHER PUBLICATIONS

PCT, International Search Report and Written Opinion Received, International Patent Application No. PCT/US2024/054318, Feb. 18, 2025, 14 pages.

(Continued)

*Primary Examiner* — Dominic E Hawkins
(74) *Attorney, Agent, or Firm* — Outside General Counsel LLP

(57) ABSTRACT

A dual differential contactless current sensor uses a pair of magnetic sensors placed adjacent to a conductor, such as a metallic trace on a printed circuit board, which is conducting electrical current. The ability to detect and measure a tampering magnetic field in such a sensor is provided by a circuit that sums the outputs of the pair of magnetic sensors. The circuit can output an alarm signal, such as a programmable one-bit alarm that indicates when the external magnetic field exceeds a programmed threshold, or an analog voltage proportional to the external field. The alarm signal can be polled by additional circuitry that indicates to the stakeholders that a party is attempting to alter the power measurement.

20 Claims, 9 Drawing Sheets

Related U.S. Application Data

(60) Provisional application No. 63/595,857, filed on Nov. 3, 2023.

(56) References Cited

U.S. PATENT DOCUMENTS

| | | | |
|---|---|---|---|
| 5,898,370 | A | 4/1999 | Reymond |
| 6,885,302 | B2 | 4/2005 | Seal et al. |
| 7,432,823 | B2 | 10/2008 | Soni |
| 7,495,555 | B2 | 2/2009 | Seal et al. |
| 8,305,232 | B2 | 11/2012 | Gilbert et al. |
| 8,688,407 | B2 | 4/2014 | Pride |
| 8,730,042 | B2 | 5/2014 | LaFrance |
| 8,880,366 | B2 | 11/2014 | Hampel et al. |
| 9,194,899 | B2 | 11/2015 | Zoldi et al. |
| 9,506,950 | B2 | 11/2016 | Ramirez |
| 9,519,035 | B2 | 12/2016 | Ramirez |
| 9,658,254 | B2 | 5/2017 | Ramirez |
| 10,330,713 | B2 | 6/2019 | Banhegyesi et al. |
| 10,527,651 | B2 | 1/2020 | Wood et al. |
| 10,578,659 | B2 | 3/2020 | Kraus et al. |
| 10,656,190 | B2 | 5/2020 | Abbas |
| 10,935,612 | B2 * | 3/2021 | Belin .................. G01R 15/205 |
| 11,393,322 | B2 | 7/2022 | McDougall, Jr. et al. |
| 11,674,987 | B1 | 6/2023 | Yu |
| 11,815,533 | B2 * | 11/2023 | Houis .................. G01R 15/148 |
| 11,863,589 | B2 | 1/2024 | Koval et al. |
| 2007/0103334 | A1 | 5/2007 | Soni |
| 2010/0181999 | A1 * | 7/2010 | Sudai ...................... G06F 21/86 |
| | | | 324/239 |
| 2013/0120156 | A1 | 5/2013 | Swaminathan et al. |
| 2013/0241540 | A1 | 9/2013 | Ausserlechner et al. |
| 2013/0293224 | A1 * | 11/2013 | Kotera .................. G01R 19/10 |
| | | | 324/252 |
| 2014/0266171 | A1 | 9/2014 | Mosser et al. |
| 2014/0283146 | A1 | 9/2014 | Obukhov |
| 2015/0260759 | A1 | 9/2015 | Ramirez |
| 2016/0116507 | A1 | 4/2016 | Mosser et al. |
| 2017/0132902 | A1 * | 5/2017 | Foster ................ G01R 21/1333 |
| 2020/0116800 | A1 | 4/2020 | Lassalle-Balier et al. |
| 2020/0150195 | A1 | 5/2020 | Zucker |
| 2023/0119854 | A1 | 4/2023 | Mohan et al. |
| 2023/0134728 | A1 | 5/2023 | Zucker et al. |
| 2023/0273249 | A1 | 8/2023 | Müller |
| 2024/0431021 | A1 | 12/2024 | Pape et al. |
| 2025/0147085 | A1 | 5/2025 | Zucker et al. |

FOREIGN PATENT DOCUMENTS

| | | | |
|---|---|---|---|
| CN | 103592484 | B | 4/2016 |
| CN | 108072778 | A | 5/2018 |
| EP | 2430463 | B1 | 7/2013 |
| GB | 2183348 | A | 6/1987 |
| WO | 2006125336 | A1 | 11/2006 |
| WO | 2016111278 | A1 | 7/2016 |
| WO | 2017030772 | A1 | 2/2017 |
| WO | 2023079386 | A1 | 5/2023 |
| WO | 2025097093 | A1 | 5/2025 |

OTHER PUBLICATIONS

U.S. Patent and Trademark Office, Non-Final Office Action Received, U.S. Appl. No. 18/935,528, filed Apr. 4, 2025, 9 pages.

* cited by examiner

DIFFERENTIAL DUAL SENSOR CONTACTLESS MAGNETIC-MODE ELECTRICAL CURRENT SENSORS WITH TAMPER DETECTION

CROSS-REFERENCE TO RELATED APPLICATIONS

This application is a continuation-in-part of U.S. Utility patent application Ser. No. 18/935,528 filed on Nov. 2, 2024, and titled "Differential Dual Sensor Contactless Magnetic-Mode Electrical Current Sensors With Tamper Detection," which in turn claims priority to U.S. Provisional Patent Application Ser. No. 63/595,857, filed on Nov. 3, 2023, and titled "System And Method For Adding Tamper Detection To Differential Contactless Magnetic-Mode Electrical Current Sensors" both of which are hereby incorporated, in their entirety, by reference. In the event of any inconsistency between this application and the documents incorporated by reference, then this application shall control.

BACKGROUND

Contactless current sensors extract the magnitude of an electrical current in a conductor while rejecting any external magnetic fields. Currently, the most accurate method of contactless current sensing employs a pair of magnetic sensors placed at two locations along the conductor where the electrical current in the conductor induces complementary magnetic fields in the pair of sensors. Reading the magnetic fields detected by this pair of sensors allows for the rejection of external magnetic fields. The difference in the voltages output by these sensors provides a measure of the electrical current flowing through the conductor, while rejecting the influence of the external magnetic field. This method is referred to as the "dual differential contactless current sensing method."

There are many types of dual differential contactless current sensors. These sensors can be implemented using various technologies, including but not limited to Hall, anisotropic magnetoresistance (AMR), giant magnetoresistance (GMR), and tunnel magnetoresistance (TMR) sensors, and various electrical shunts, including but not limited to u-shunts, notch shunts, and slot shunts. These implementations have in common a configuration in which two sensors are placed above a curved or shaped conducting electrical shunt which carries the electrical current. The geometry of the shunt creates complementary magnetic fields at two locations due to the shape of the shunt which channels the current in the shunt conductor. If a pair of sensors are mounted at the locations of the complementary fields, then both sensors can have the same orientation such that they will both react substantially identically to any external magnetic field. The sensor pair is placed adjacent to the shunt such that the electrical current induces a complementary response. By differencing the output voltages of the sensors, a voltage representing the electrical current is produced while simultaneously rejecting the common external magnetic field.

An electrical meter, which uses such magnetic sensors to measure electricity consumption, can be deliberately subjected to a large magnetic field to tamper with readings from the electric meter. A large enough magnetic field can exceed the meter circuitry's rejection capability and even damage or alter the magnetic sensors. Thus, providing a tamper alarm in an electrical meter is very useful. Usually, a tamper alarm is provided by adding a number of extra magnetic sensors which adds bulk and expense.

As an alternative, many electrical meters use a shunt technology that adds a shunt wire to the electrical path that adds a precise resistance to the electrical path. The voltage across this shunt is measured and used to calculate the electrical current. This method is immune to magnetic tampering, but inserting the shunt introduces a power loss. Using dual magnetic sensors on a shunt is more power efficient than using a shunt wire because the dual magnetic sensors allow for a possibly lower insertion loss. The dual magnetic sensors also allow for some rejection of stray or tampering magnetic fields. Nevertheless, a large enough tampering field can cause such a system to make an error when measuring current.

SUMMARY

This Summary introduces a selection of concepts in simplified form that are described further below in the Detailed Description. This Summary neither identifies key or essential features, nor limits the scope, of the claimed subject matter.

A contactless current sensor with a pair of magnetic sensors placed at two locations along a conductor can be used both to measure the electrical current in the conductor and to detect or measure any external magnetic field, based on the complementary magnetic fields to which the pair of sensors is responsive. The difference between the voltages output by these two sensors provides a measure of the electrical current flowing through the conductor. The sum of the voltages output by these two sensors provides a measure of the external magnetic field. As a result, a contactless current sensor can detect or measure an external magnetic field, also called a tampering signal herein, based on the same signals from the same sensors used to measure the electrical current. This configuration provides a cost-effective implementation by reducing the number of circuit components and the circuit board area compared to other solutions which add sensors.

Such a circuit also is more accurate than any added external sensor can achieve because this circuit is actually co-located with, and is deriving the tampering signal from, the same pair of sensors that are measuring the magnetic fields induced by the electrical current in the conductor. The circuit uses intrinsic devices and structures, internal to an existing metering system, to extract additional data that is indicative of magnetic tampering. This approach minimizes cost and complexity for the service provider while enhancing the capabilities of the system.

While existing implementations of differential detectors reject the common external field from the result voltage, the circuit additionally extracts the value of the common external field which can be used to generate a tunable threshold-based digital alarm bit that is set to a logical "true" whenever the external field exceeds the programmed threshold. With minimal added circuitry, the extraction, detection, or measurement of the common magnetic field to be represented as a voltage to which a threshold may be established and programmed to trigger an alarm bit. Thus, a logic circuit can be used which is triggered if the external magnetic field exceeds a threshold magnitude. This trigger can be configured to respond to either or both polarities of a tampering magnetic field.

Aside from tamper resistance, the circuit also allows for monitoring the external magnetic field during use of the current measurement device which may provide useful diagnostics.

The circuit enhances dual-differential magnetic measurement systems while allowing for tamper detection thereby making it feasible to use a standalone dual-differential magnetic current measurement system that can detect tampering without requiring added external components, sensors, and circuitry.

Accordingly, in one aspect, an electrical circuit includes a pair of magnetic sensors placed adjacent to a conductor, each providing an output signal responsive to electrical current flowing through a portion of the conductor. A first electrical circuit processes these output signals to produce a first signal indicative of the electrical current flowing through the conductor. A second electrical circuit processes the output signals to produce a second signal indicative of an external magnetic field imposed upon the pair of magnetic sensors.

In another aspect, an electrical utility meter for a building includes a pair of magnetic sensors placed adjacent to a conductor providing electrical power to the building. A first electrical circuit processes the sensor output signals to produce a first signal indicative of the electrical current. A second electrical circuit processes the signals to produce a second signal indicative of an external magnetic field. An output circuit communicates at least a meter signal based on the first signal and an alarm signal based on the second signal.

In a further aspect, a system for measuring electrical current while detecting external magnetic fields includes means for generating complementary signals in response to electrical current in a conductor, means for processing these signals to generate a first signal indicative of the electrical current and a second signal indicative of any external magnetic field, means for generating an alarm signal if the external field exceeds a threshold, means for persistently storing event information about interference instances, and means for reading this stored information.

In yet another aspect, a method for detecting attempts to interrupt power measurements involves generating complementary signals using magnetic sensors. These signals are processed to produce a first signal indicative of electrical current. These signals also are processed to produce a second signal indicative of an external magnetic field. The process can involve determining whether the external magnetic field exceeds a tampering threshold.

In an additional aspect, an electrical circuit for use with a current measurement circuit includes a tamper detection circuit that processes output signals from a pair of magnetic sensors to produce a signal indicative of an external magnetic field imposed upon the sensors.

Any of the foregoing can include one or more of the following features. The second signal is indicative of the magnitude and polarity of the external magnetic field. The electrical circuit is embodied in an integrated semiconductor circuit. The pair of magnetic sensors and the first electrical circuit implement a dual differential current measurement which supports rejection of external magnetic fields. The first electrical circuit comprises an analog circuit. The second electrical circuit comprises an analog circuit. The conductor comprises a shunt.

Any of the foregoing can include one or more of the following features. The output circuit comprises a communication link from the electrical utility meter to a communication system of a utility service provider to transmit the meter signal and the alarm signal. The communication link can include an encrypted communication link wherein the electrical utility meter and the communication system of the utility service provider are endpoints and wherein the endpoints are authenticated to each other. The endpoints may be authenticated at least in part using digital certificates. The communication link includes a wireless communication link. The communication link includes a wired communication link. The output circuit is configured to transmit the meter signal or the alarm signal or both to the communication system of the utility service provider in response to a request from the communication system.

Any of the foregoing can include one or more of the following features. The first circuit is programmable such that first computer program instructions configure the first circuit to process the respective output signals from the pair of magnetic sensors according to a first programmable function to generate the first output signal. The output circuit is configured to change the first computer program instructions of the first circuit in response to a request from the communication system. The second circuit is programmable such that second computer program instructions configure the second circuit to process the respective output signals from the pair of magnetic sensors according to a programmable function to generate the second output signal. The output circuit is configured to change the second computer program instructions of the second circuit in response to a request from the communication system. The output circuit is programmable such that third computer program instructions configure the output circuit to process the first output signal or the second output signal according to a programmable function to generate the meter signal or the alarm signal. The output circuit is configured to change the third computer program instructions of the output circuit in response to a request from the communication system.

Any of the foregoing can include one or more of the following features. The output circuit includes an alarm circuit having a first input receiving the second signal and a second input indicative of a threshold and an output that indicates whether the measured external field has exceeded the threshold. The predefined threshold may correspond to an event wherein a tampering magnetic field exceeds a tolerance for reliable operation of the electrical utility meter. The alarm circuit includes an analog to digital converter having an input receiving the second signal and a digital output providing an n-bit representation of the second signal. The alarm circuit generates and stores event information including at least a time stamp indicating when the measured external field exceeded the predefined threshold. The output circuit includes a latch having a data input receiving the event information and a trigger input receiving the output of the alarm circuit. In response to the output of the alarm circuit indicating the measured external field exceeds the predefined threshold, the latch is triggered and stores the event information as a latch output. The electrical utility meter further includes a processor configured to receive the latch output as an interrupt signal or as an event signal. The latch persistently stores the event information such that the event information is maintained if power to the latch is interrupted. The latch includes a non-volatile memory to store the event information. The output circuit is configured to transmit the event information to a device remote from the electrical utility meter.

Any of the foregoing can include one or more of the following features. An alarm signal is set in response to the external magnetic field exceeding the threshold. In response to the external magnetic field exceeding the threshold, event information is persistently stored. Persistently storing event information includes storing the event information in a non-volatile memory. The non-volatile memory may be internal to an integrated circuit that includes circuits configured to perform processing of the complementary signals. The non-volatile memory may be external to an integrated circuit that includes circuits configured to perform the processing of the complementary signals. Event information can be transmitted to a utility management system server.

Any of the foregoing aspects can be combined with one or more of the foregoing aspects. Any of the foregoing features can be used in combination of one or more of the foregoing features or aspects.

The following Detailed Description references the accompanying drawings which form a part of this application, and which show, by way of illustration, specific example implementations. Other implementations may be made without departing from the scope of the disclosure.

DETAILED DESCRIPTION

Figure 1:
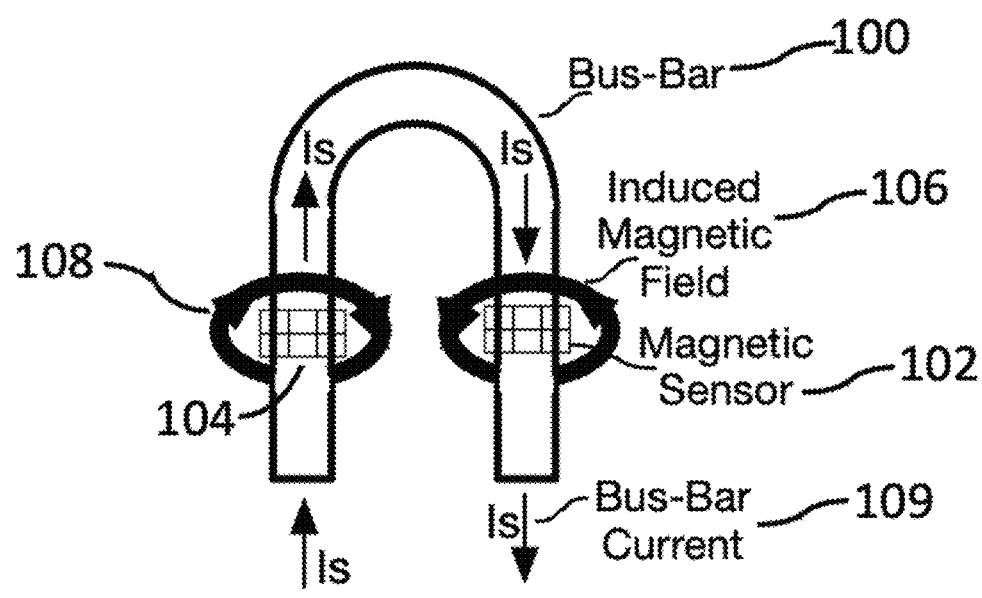
FIG. 1 shows a differential pair of magnetic sensors placed adjacent to a u-shaped electrical current shunt.

The present invention is not limited in its application to the details of construction and the arrangement of components set forth in the following description of, or that are illustrated in the drawings.

A circuit that uses the dual differential contactless current sensing method to detect or measure electrical current in a conductor, such as a wire or pc board trace, detects or measures electrical current by differencing a pair of sensor outputs. Such a circuit can be embodied in a single integrated circuit. The differential methodology makes the detection relatively immune to external tampering magnetic fields which may be used to sabotage an electrical meter. While the differential method provides some level of immunity, but a large enough external magnetic field can still damage the sensors or induce a metering error.

In addition to or as a modification to the circuit using the pair of sensors to measure the electrical current in the conductor, another circuit using the pair of sensors can process the same signals from the pair of sensors to extract or detect or measure the magnitude and polarity of a tampering magnetic field. The detected presence of a tampering field can then be communicated to another device, another entity, such as the electrical utility service provider, or energy ecosystem trust and security managers.

The basic principles described herein can be applied to all dual-differential contactless current sensors. A shunt configuration which is u-shaped is one example configuration of a dual-differential contactless current sensor. In this configuration, a shunt has a "U"-shape (such as shown in FIG. 1 to be explained in more detail below), with two (dual) magnetic sensors placed adjacent to the shunt, one sensor on each leg. Both sensors are placed with substantially identical alignment such that if the u-shunt is exposed to an external magnetic field, both sensors will produce a substantially identical voltage output because they both are exposed to a magnetic field of approximately the same magnitude and approximately the same polarity. This pair of output signals is referred to as the common mode signal. Similarly, when an electric current is forced through the u-shaped shunt, it produces a magnetic field around both sensors, but these magnetic fields have the opposite polarity. Thus, the magnetic output due to the electrical current in the shunt enveloping each of the two sensors has an opposite polarity. This pair of signals is referred to as the differential mode signal.

To provide a voltage analog of the current in the wire, the common practice is to take the difference of the voltage signals produced by the pair of sensors. This differential mode provides the output results of the system, with the amplitude of the voltage being proportional to the current and the polarity of the voltage tracking the polarity of the current. Since both sensors have substantially identical orientations, they will have an identical response to any external magnetic field. When their outputs are differenced, the system output voltage substantially rejects the common external magnetic field. This rejection of the external magnetic field is the principle of operation of the dual differential contactless current sensor. This sensor is thus tamper-resistant. This sensor can reject small amounts of stray or deliberately induced magnetic fields, but a strong enough external magnetic field may saturate or even damage the magnetic sensors and lead to a false reading. External magnetic fields are sometimes applied to the power meter box by power company customers or their proxies in attempt to sabotage the meter with the goal of altering the power meter readings.

A cost-effective tamper detection capability can be provided by exploiting the existing properties of the dual differential contactless current sensor. Since both elements of the sensor pair have substantially the same orientation, they will have similar output voltages in response to an external magnetic field. Summing their two outputs will produce a signal that is indicative of the amplitude and polarity of the external magnetic field while rejecting the signals produced by the electrical current in the u-shaped shunt. This sum of the common mode signal can be processed by a comparator that produces a digital output, a tamper alarm signal, which indicates when the external magnetic field exceeds a programmed threshold. This digital tamper alarm signal may be latched and saved, optionally along with other information, such that the system is able to detect tampering and produce a notification of tampering.

An analog circuit, for example, can be constructed (see, e.g., FIG. 4) to extract an analog signal indicative of an external magnetic field. Such an analog signal can be processed by a comparator (see, e.g., 502 in FIG. 5A), to produce a digital alarm signal that indicates when the external field has exceeded a programmed or threshold. The thresholds of a window comparator (e.g., 502 in FIG. 5A) are set by ratios of resistors in a resistor string. Alternatively, the threshold may be programmed using a code register that controls switches that tap selectively into a resistor array (see, e.g., FIG. 5B). Other kinds of comparators and programmable comparators can be used.

Figure 8:
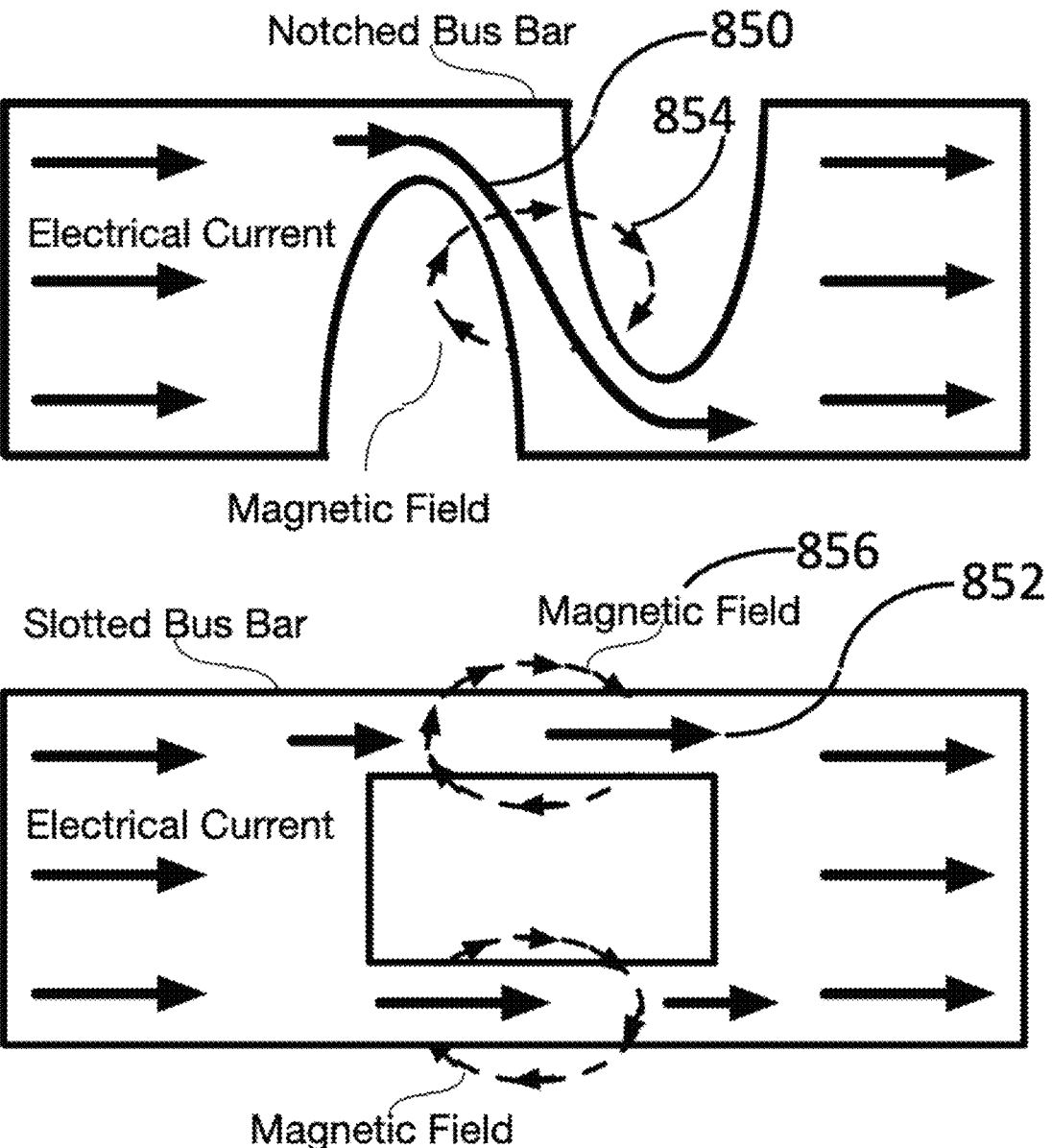
FIG. 8 is a schematic diagram of an alternative shunt device shape.

A variety of implementations can embody the principles of using dual differential sensing with common mode field extraction. For example, changing the order of signal processing stages implements the same principle. Likewise, various electrical shunts, other than a u-shaped shunt, can cause a pair of magnetic sensors to output complementary signals. Two examples of alternative shunts are shown in FIG. 8.

Embodiments that utilize alternative sensors to the embodiment using TMR sensors deliver comparable results. These include AMR, GMR, Hall, and any planar magnetic sensors that can detect the magnetic field in a conductor when placed adjacent to that conductor. A planar magnetic sensor is defined herein as a sensor that does not need to enclose a wire but can be placed in proximity to the wire. An inductor that encircles the wire is an example of a non-planar sensor. Equivalent systems that use inductive sensors that encircle a wire can be configured to constitute equivalent results. These approaches tend to be bulky and innately more immune to external fields and require larger sabotaging fields to induce a meter error, but the same principles still apply for measurement of the electrical current and detection of an external magnetic field.

A non-limiting description of the processing that an electric circuit performs will now be explained. This processing comprises three stages: 1. The primary function of measuring the electrical current based on dual differential contactless current measurement using a pair of magnetic sensors, 2. The function of detecting any external magnetic field applied to the magnetic sensors, and 3. The generation of an alarm, for example, to alert a service provider of tampering.

Stage 1: A pair of sensors are placed adjacent to an electrical conductor, such as a conductive trace on a printed circuit board or a wire, with the same orientation, at two separate locations where electrical current flowing through the conductor will produce a complement of magnetic fields. The outputs of the sensors are differenced to produce an electrical signal that represents the magnitude and polarity of the electric current in the conductor. Because the respective outputs of the pair of sensors are differenced, the resultant output signal substantially rejects any common external magnetic field until that external magnetic field is large enough to saturate the sensors and electronics, causing a metering failure. In some implementations, one of the magnetic sensors can be rotated 180 degrees, such that the sensors have opposite orientations. In such an implementation, the output signal indicative of the electrical current can be derived by summing the outputs of the two sensors.

Stage 2: Additional electronic circuitry processes the outputs of the sensors to provide an additional signal, called a "tampering signal", that is proportional to any external magnetic field, such as a tampering external magnetic field. To provide this additional signal, the additional electronic circuitry sums the signals from the two sensors. In some implementations, if one of the magnetic sensors had been rotated 180 degrees in Stage 1, then the external magnetic field will be detected by differencing the two outputs of the magnetic sensors.

Stage 3: The tampering signal is converted to a digital signal that can be communicated to, for example, a service provider or that can be stored persistently. This conversion can be performed by any of several methods, including but not limited to: a) a fixed window comparator creates a digital alarm if the absolute value of the external tampering field exceeds a fixed value, b) a programmable window comparator creates a digital alarm if the absolute value of the external tampering field exceeds a programmable value, and c) the analog value of the electrical tampering signal may be digitized by an n-bit analog to digital converter. Data indicative of the digital alarm, n-bit digital value, or other related information can be stored persistently or transmitted to a remote device. For example, stored information can be read by a service provider, such as via a serial data bus or as a parallel output from the integrated circuit connected to a parallel data bus, or can be transmitted to the service provider. Service providers include but are not limited to electrical utility service providers, and energy ecosystem trust and security managers.

This methodology applies to a variety of sensor types and electrical shunt topologies. For example, the proposed methodology can be used with a pair of TMR sensors placed adjacent to, for example, on top of a u-shaped current shunt.

In some implementations, the signal or signals indicative of or related to tampering are communicated to a data processor. The data processor may reside within a housing that forms a utility meter box. These signals may be in the form of analog voltages, several digital bits, or a digital bus that may carry the results of a series of analog to digital conversions that represent the tampering field, and optionally status bits that result from latched versions of the tampering indicator signal.

In some implementations, such a processor interfaces to a service provider via a communication link. Examples of a communication link include, but are not limited to, a wired bus interface or via a radio communication interface (see. e.g., FIG. 10). In one embodiment, the data processor is incorporated into block 803 of FIG. 10.

Having now described some principles, each of the Figures, illustrating a variety of example circuit implementations, will now be explained in further detail.

FIG. 1 shows a U-shaped electrical current shunt 100 with two magnetic sensors 102 and 104. Electric current (Is) and induced magnetic fields 106, 108 also are illustrated schematically. In FIG. 1, a pair of differential sensors 102, 104 are placed adjacent to the u-shaped electrical shunt 100. As an example, the sensors 102, 104 can be implemented using tunnel magnetoresistance (TMR) sensors. While the sensors appear to be illustrated on shunt 100, such sensors are contactless. In the implementation shown in FIG. 1, the two sensors are of the same type and have identical co-planar orientations such that they respond substantially the same to an external magnetic field. Electronically differencing the sensor outputs in the voltage domain extracts a voltage representation of the value of the electric current in the shunt. Also, electronically adding the voltage outputs of the sensor pair extracts a voltage-based representation of any external magnetic field. This voltage can be processed and compared against selectable trigger references to create an external field tampering alarm.

Figure 2:
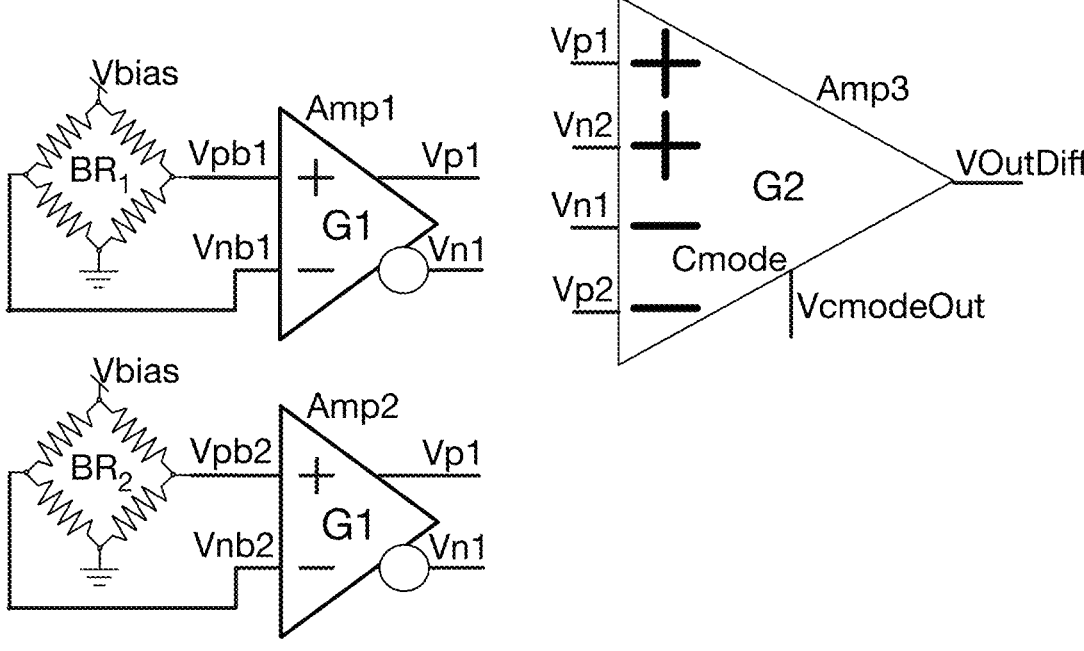
FIG. 2 is a block diagram of an example implementation of an electrical circuit used to extract the value of the electric current used in conjunction with the sensors in FIG. 1.

FIG. 2 is a block diagram of an example implementation of an electrical circuit used to extract the value of the electric current in a u-shaped electrical shunt using a pair of TMR sensors placed on top of the shunt, such as shown in FIG. 1. The differential outputs of the sensor pair Br1 and Br2 are labeled, respectively, Vpb1 and Vnb1 for the first sensor Br1, and Vpb2 and Vnb2 for the second sensor Br2. Both sensors are biased using a voltage labeled Vbias. A first amplifier (Amp1) and a second amplifier (Amp2) buffer and may add the same gain (G1) to the differential bridge voltages, and output, respectively, signals Vp1 and Vn2 and signals Vp2 and Vn2. A third amplifier (Amp3) converts the signals to single-ended, centered around VcmodeOut, taking the difference of the two bridge outputs to create a voltage (VOutDiff) proportional to the electrical current in the u-shaped electrical current shunt. In sum, the differential outputs of the sensor pair Br1 and Br2 are buffered and differenced, effectively extracting a voltage analog of the electric current in the shunt.

Figure 3:
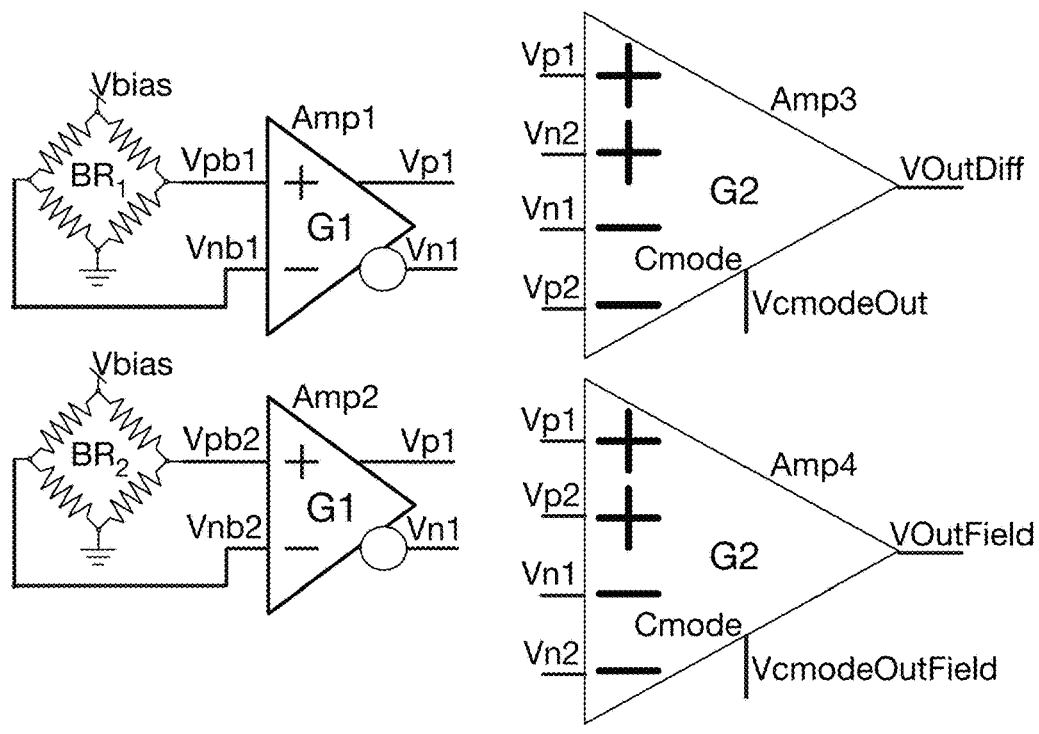
FIG. 3 is a block diagram of an example implementation of the electrical circuit in FIG. 2 modified to include an additional circuit to detect an external magnetic field.
Figure 4:
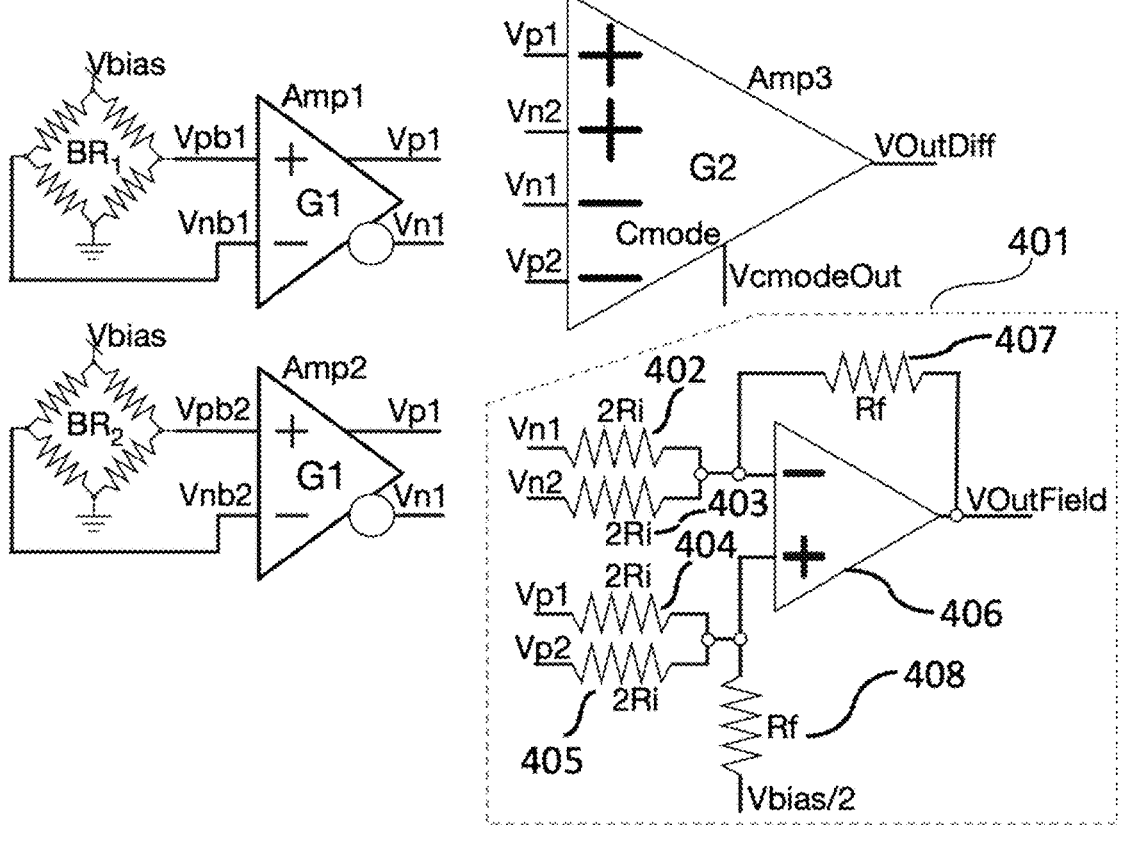
FIG. 4 is a block diagram of an example implementation of the electrical circuit of FIG. 3.

FIG. 3 is a block diagram of an example implementation of an electrical circuit, which includes a circuit such as illustrated in FIG. 2, as modified to include an additional circuit to detect an external magnetic field. In FIG. 4, the additional circuit is illustrated as a fourth amplifier Amp4. This fourth amplifier sums the outputs of the sensor pairs Br1 and Br2 by combining signals Vp1 and Vp2 and signals Vn1 and Vn2 to generate a signal VOutField which is proportional to any external magnetic field to which the magnetic sensors are exposed, and may thus detect tampering efforts. The signal VOutField is a single-ended, centered around VcmodeOutField. The gain G1 of amplifier Amp1 and the gain G1 of amplifier Amp2 are not strictly the same, but must be closely matched. Likewise, gain G2 of amplifier Amp3 and gain G2 of amplifier Amp4 are not strictly the same, but must be closely matched.

An ambient magnetic field is a magnetic field that is unrelated to the magnetic field generated by the electrical current in the sensing adjacent to the sensing elements of dual differential current sensor. Ambient fields that affect the sensors due to the earth's magnetic field are low in level and dependent on the orientation and position of the current sensor assembly. These fields are low in level and all dual differential sensors are able to reject them. There may also be ambient fields produced by electrical circuitry operating in proximity to the magnetic sensors. It is presumed that these are also small enough so that the dual differential sensor can reject them from the current measurement by design. A tampering field is much larger and is intended to be large enough to overwhelm, or even damage the sensor, causing the sensor to incorrectly read the electrical current value. The exact magnetic field intensity that will disturb a dual differential magnetic current sensor does not have a general value since each sensor system has a unique design with a unique vulnerability. Hence, the present invention has a variable/programmable threshold that is adjusted to suit the particular sensor implementation and position in the environment. Generally, the threshold is typically set a good margin above the strength of the Earth's ambient magnetic field, which is typically from 2× to 5× the size of the Earth's ambient magnetic field and therefore, should avoid false triggering of a tamper alarm. Nevertheless, the sensor system will still be able to detect magnetic tampering at low enough levels to insure in most cases that the alarm is triggered before the effects of the tampering overwhelm the sensor.

The above described setting of levels to detect tampering can be restated as: the external field tampering threshold is set such that it lies between the known value of the Earth's magnetic field and the specific value at which the sensors utilized for the dual differential sensor measurement are subject to either saturation or damage; and further wherein, the saturation level of a dual differential sensor pair is defined and measured as the external field level at which the sensor begins to demonstrate a reduced response to the differential electrical current signals present in the shunt wire. In other words, if the system is actively measuring an electrical current of the maximum. intended value which is a fixed amount of electrical current, an external magnetic tampering field will reduce the measured value of that electrical current when the external field exceeds a specified level. This specified level is used to determine the threshold setting. This sensor threshold is likely to vary across different sensor types and across specific implementations of these sensor pairs.

Figure 9:
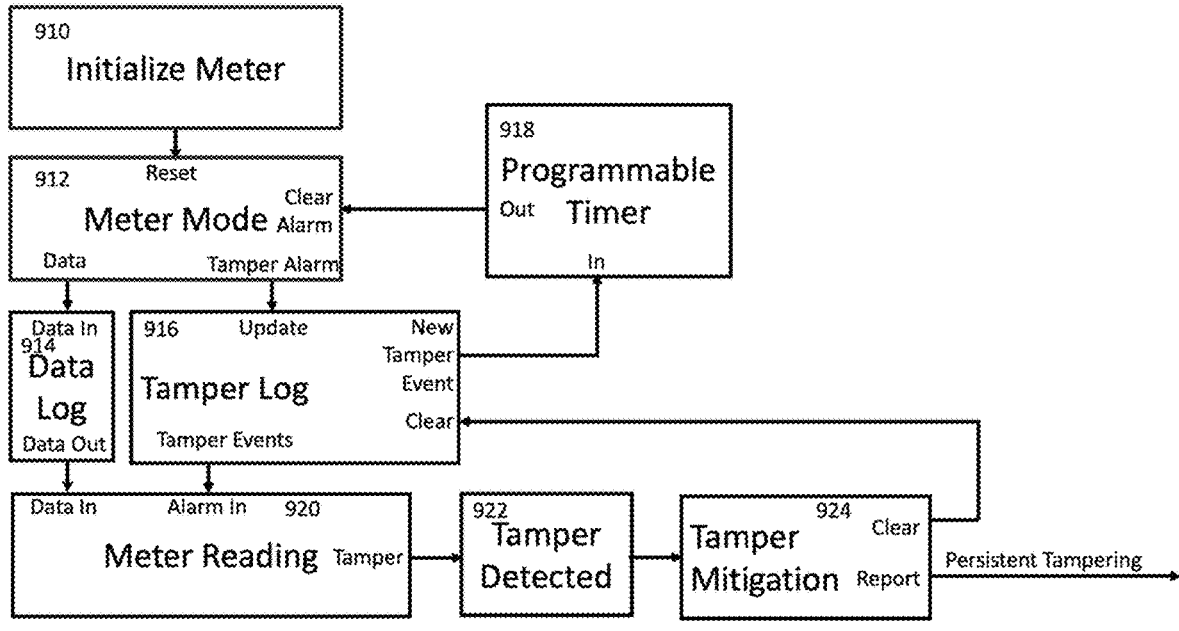
FIG. 9 is a block diagram of an example implementation of an electric utility meter box.

FIG. 9 illustrates a use case or application of the present invention in which after a possible tampering magnetic field is registered by the system, there is a loop (which contains the Programmable Timer element 918 in FIG. 9) with a timer that tests whether the tamper field is persistently above the set value of the tampering threshold. This conditional loop is intended to prevent ambient noise from triggering a tamper alarm. However, in some situations, it may be desirable to immediately, and irrevocably, trigger the tamper alarm if the tamper field exceeds a specified threshold. This requirement exists because in some circumstances once an ambient magnetic field exceeds the device's ambient rejection range, the device will be unable to respond to ambient fields and the device may be permanently damaged. In these situations, the device may be rendered unable to detect tampering and may also be unable to accurately detect electrical current. This permanent altering of the electrical current sensor system is one of the goals of those who wish to interfere with accurate current measurements. Thus, in such situations, it is required that the sensor system of the present invention triggers when the ambient field exceeds a specified external magnetic field level. The anti-tampering device is not reset until a field inspection verifies the state of the device and its ambient magnetic field conditions.

Thus, here are three example cases of triggering of a tampering alarm.

Case 1: The alarm threshold is exceeded and the sensor is undamaged. In this case, the sensor plus system may continue to monitor for alarm conditions. If further alarm events occur, there may be a conclusion that there is persistent tampering. If no further alarm bit trigger events occur, the system may conclude that the initial alarm trigger event was only due to noise.

Case2: The alarm threshold is exceeded, and the tampering field has damaged the sensor. In this case, the sensor may continue to issue a tamper alarm, and the system will conclude that tampering is evident.

Case3: The alarm threshold is exceeded, and the tampering field has damaged the sensor. In this case, the sensor may only indicate zero or a very low electrical current. In this case, the system may continue to monitor the customer's electrical current usage and compare usage levels and patterns after the alarm was triggered to usage levels and patterns before the alarm was triggered. These patterns may result in a reasonable conclusion that tampering has occurred, in which case an on-site inspection is justified.

FIG. 4 is a block diagram of an example implementation of the electrical circuit of FIG. 3, illustrating an example implementation of a circuit 401 which implements the detection of the external magnetic field. Circuit 401 includes input resistors 402, 403, 404, and 405, all having the same resistance 2Ri. The negative input of amplifier 406 is connected to resistors 402 and 403, which are connected respectively to receive signals Vn1 and Vn2; the positive input of amplifier 406 is connected to resistors 404 and 405, which are connected respectively to receive signals Vp1 and Vp2. A resistor 407 of impedance Rf also connects the output of the amplifier 406 to its negative input. The positive input of amplifier 406 also is connected to Vbias/2 via resistor 508 which also has impedance Rf. In some implementations, the output VOutField is an analog output that may have a high impedance mode, which would allow several integrated circuits to share a common output wire. This allows multiple external current sensors to share a common signal processing integrated circuit. In the case of a 3-phase house power, the 3 phases could be independently sensed, but share a common integrated circuit with time multiplexing of the signal processing.

Given a circuit that outputs a signal indicative of the external magnetic field applied to the magnetic sensors, further logic can be added to generate an alarm signal. For example, the signal indicative of the external magnetic field can be compared to a threshold. The alarm signal, and other information that can be captured at the time the alarm signal is generated, can be persistently stored as event information related to the alarm signal. Some example circuit implementations that generate alarm signals will now be provided.

Figure 5A:
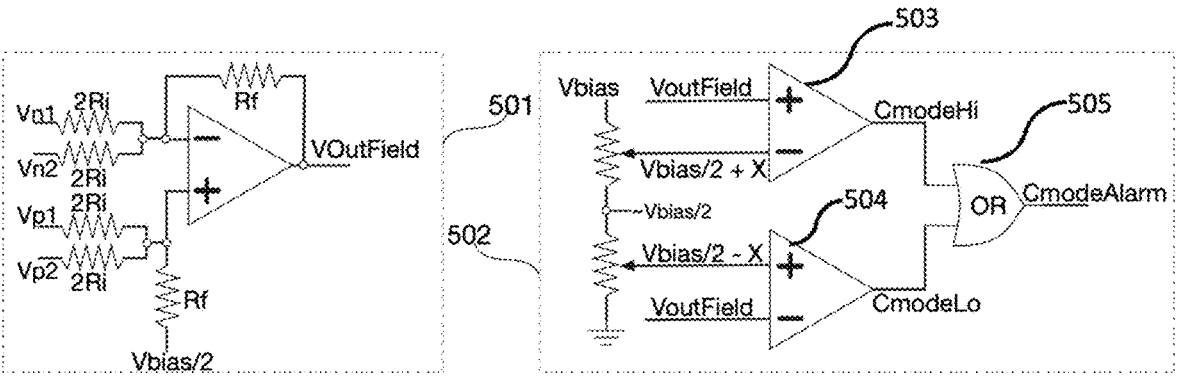
FIG. 5A is a block diagram of an example implementation of an electrical circuit which includes a circuit that generates an alarm signal when an excessive external magnetic field is detected.

FIG. 5A is a block diagram of an example implementation of an electrical circuit that implements the detection of an external magnetic field using a fixed window comparator (502). The circuit 501, such as the circuit 401 described above in connection with FIG. 4, extracts a signal proportional to the external magnetic field (VoutField). Circuit 502 generates an alarm signal (CmodeAlarm) based on a threshold. Thus, element 501 does the analog extraction which feeds a signal to element 502, which is a window comparator that creates a digital alarm whenever the external field exceeds a threshold. In this example implementation shown in FIG. 5A, this output labeled CModeAlarm is a digital output. The CModeAlarm signal may be configured as an active low signal using an internal pullup resistor. Using an active low signal would allow for a multiplicity of these output alarms on multiple integrated circuits to be combined to a common line.

In the example implementation of FIG. 5A, a first amplifier 503 compares the signal VoutField (at its positive input) to a positive threshold set by a value Vbias/2+X (at its negative input), whereas a second amplifier 504 compares the signal VoutField (at its negative input) to a negative threshold set by a value Vbias/2−X (at its positive input). A voltage divider comprising variable resistors 505 and 506 of equal overall resistance provide the Vbias/2 signal, whereas X is set by adjusting the variable resistance. The first amplifier 503 outputs a signal labeled CmodeHi as a result of its comparison; the second amplifier 504 outputs a signal labeled CmodeLo as a result of its comparison. The output signals CmodeHi and CmodeLo are inputs to an or gate 505, the output of which provides the CmodeAlarm signal.

Figure 5B:
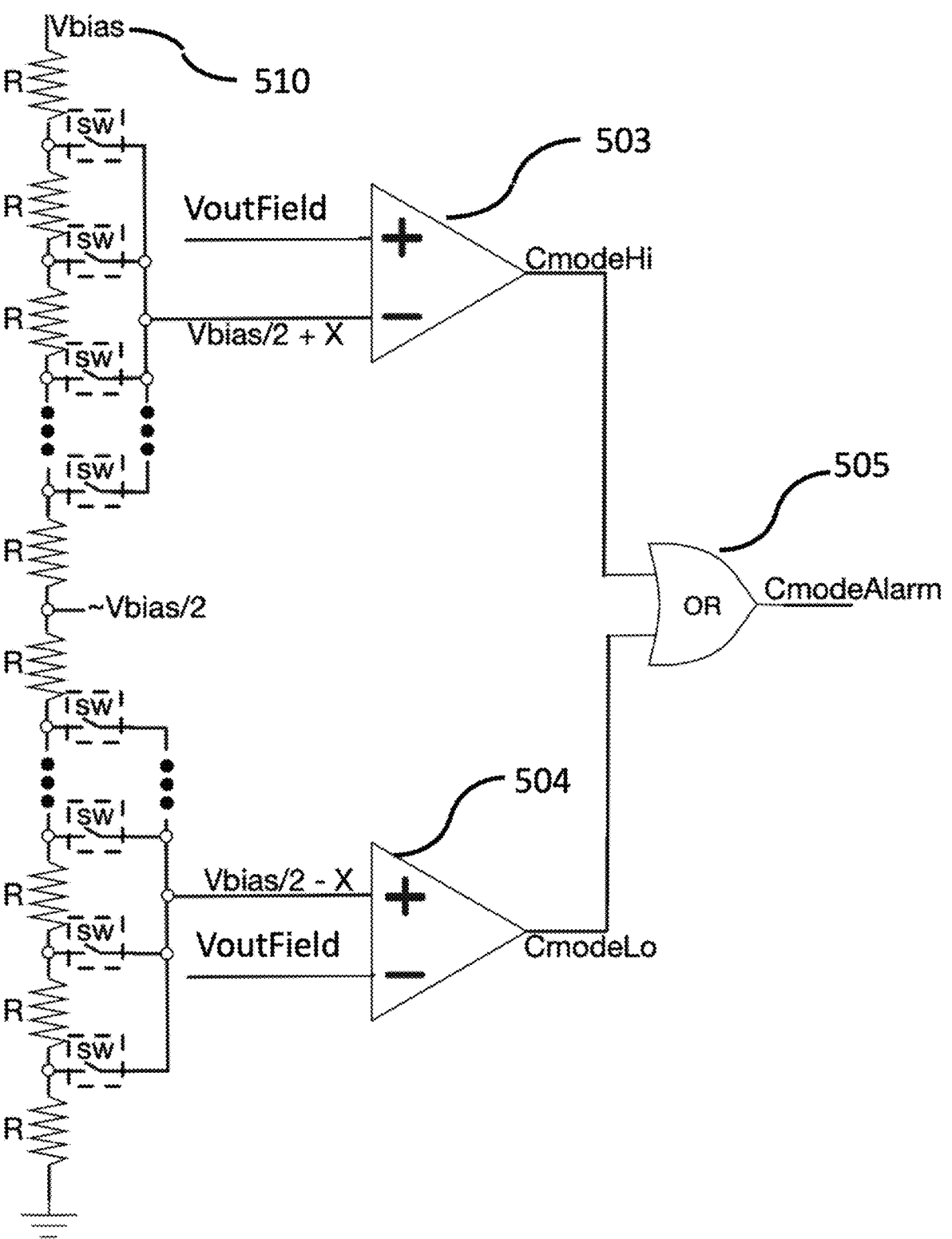
FIG. 5B is a block diagram of an example implementation of an electrical circuit which includes a programable window detector in a circuit that generates an alarm signal.

FIG. 5B is a block diagram of an example implementation of an electrical circuit in which the window comparator includes a digitally programmable window comparator, but otherwise has components similar to the implementation described in connection with FIG. 5A. Both the high side and the low side detectors 503 and 504 have inputs derived by a circuit 510 comprising array of n resistors labeled R, with an array of n−1 switches labeled SW. A digital selector (not shown) selects only one of the switches on the high side, and only one of the switches on the low side to be turned on. This configuration of the switches enables selection of a multiplicity of window sizes/thresholds. The resistors need not be matched. They can be flexibly sized to allow for a minimum of switches and taps with a correspondingly small digital register that controls the window size.

Figure 6:
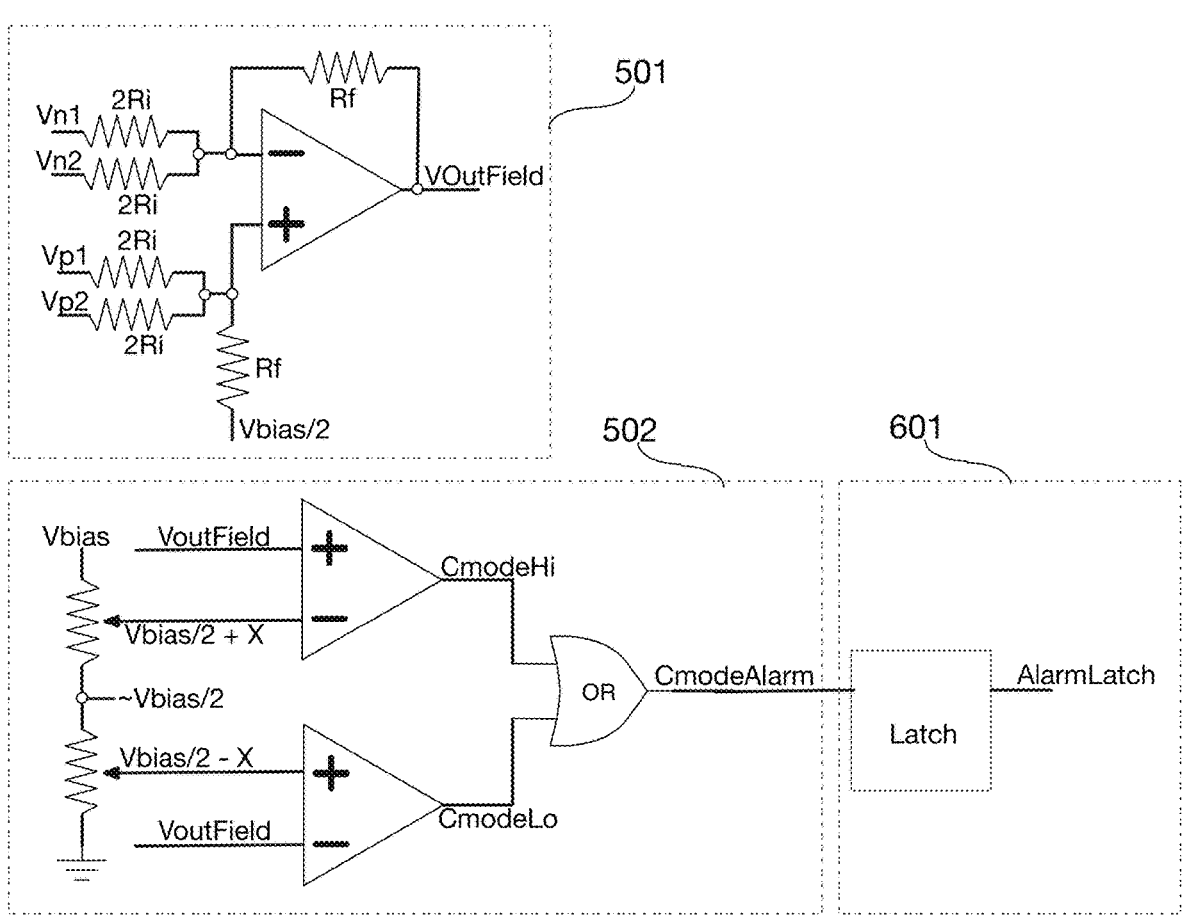
FIG. 6 is a block diagram of an example implementation of an electrical circuit with a latch to store an alarm signal.

FIG. 6 is a block diagram of an example implementation of an electrical circuit with a latch to store an alarm signal. In FIG. 6, a circuit 501 generates a signal indicative of the external magnetic field (VOutField). Also, the output of circuit 502, similar to those shown in FIGS. 5A and 5B, are an input to a latch circuit 601, which latches the signal CmodeAlarm as an alarm signal labeled AlarmLatch. The latch is triggered by the edge of the CmodeAlarm signal. The latch 601 holds the alarm state to indicate that at some time the external magnetic field had exceeded the threshold. The output of this latch 601 may also be active low by using an internal pullup resistor that will allow multiple latched outputs to be connected in parallel, sharing the same wire.

Figure 7:
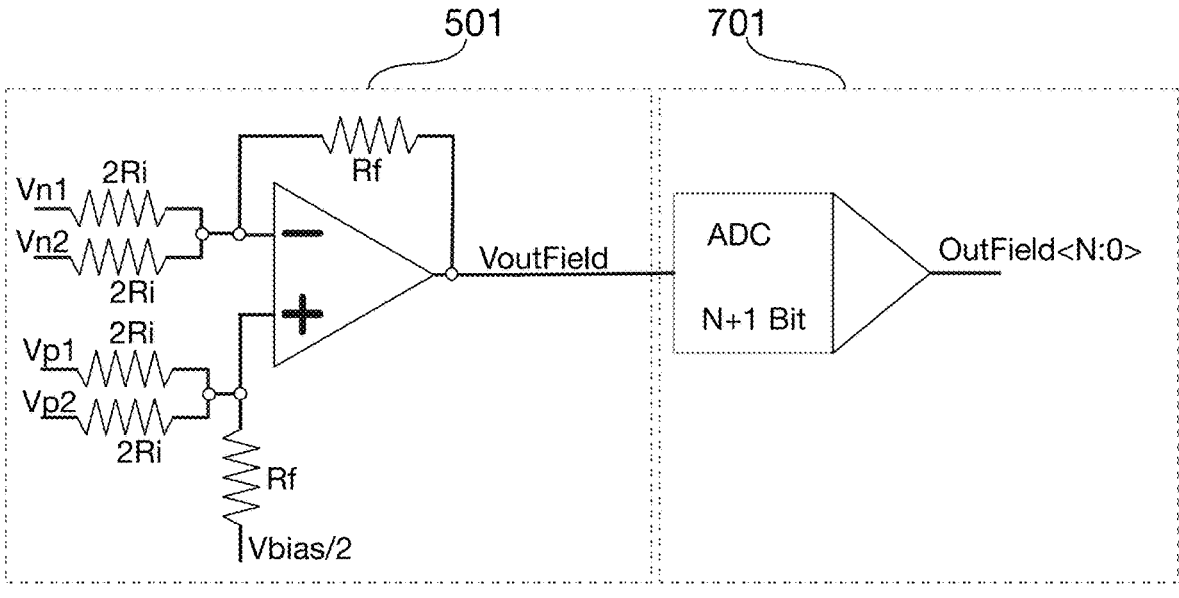
FIG. 7 is a block diagram of an example implementation of an electrical circuit using an analog-to-digital converter in a circuit that generates an alarm signal.

FIG. 7 is a block diagram of an example implementation of an electrical circuit using an analog-to-digital converter in a circuit that generates an alarm signal. In FIG. 7, the analog detection circuitry 501 which outputs the signal VOutField, similar to the circuits described above, is combined with an analog-to-digital converter (ADC) 701, which replaces the window comparator shown in FIGS. 5A and 5B. In the example shown in FIG. 7, this circuit adds an (n+1)-bit analog-to-digital converter to process the VoutField signal to generate an (n+1)-bit digital output signal, labeled OutField<N: 0>, that represents the amplitude of the external magnetic field as detected by the magnetic sensors. In this case, the analog output is repeatedly (or periodically) converted to an (n+1)-bit digital code for processing by a microprocessor. The ADC 701 can interface with a microprocessor that is either on the same integrated circuit or that is externally located and interfaces via a serial or parallel bus. Thus, the ADC 701 converts the analog voltage which represents the amplitude of the external tampering field to a digital number. Another circuit or a host system can store this digital data or process this digital data, or both, such as by performing the comparison of the digital data to a digital alarm threshold. If the value representing the magnitude of the tampering field exceeds the threshold, an alarm is generated.

FIG. 8 is a schematic diagram of alternative shunt device shapes. In FIG. 8, two examples of alternative shunt device shapes are shown, which can be used instead of the u-shaped shunt that is shown in FIG. 1. The electric current paths and the magnetic fields generated by the currents are indicated at 850, 852 and 854, 856, respectively. It is possible to place non-contact sensors of various technologies in proximity of these shunt structures to get equivalent behavior to that of the u-shunt.

FIG. 9 is a block diagram of an example implementation of an electric utility meter box. An "Initialize Meter" block 910 stores and outputs parameters for operation of the meter box and enables the metering functions. A maximum allowable tampering field threshold can be set in this phase, and can be input by a user or a remote system. A Meter Mode" block 912 controls a main operational mode in which the electrical current is being reported and the magnitude of the tampering field is being monitored. Data representing the magnitude of the electrical current is continuously being transmitted to the "Data Log" block 914. Data representing the magnitude of the tampering field is continuously being transmitted to the "Tamper Log" block 916. If the magnitude of the tampering field exceeds a preset threshold, the "Tamper Alarm" is activated. A "Programmable Timer" 918 can be used to clear the Tamper Alarm after a preset timing interval. If the Tamper Alarm is again or persistently triggered, a "Meter Reading" block 920 determines whether the tampering field values represent a random noise event or actual tampering. A "Tamper" signal is passed from "The Meter Reading" block to the "Tamper Detected" block 922 and to a "Tamper Mitigation" block 924. The Tamper Mitigation block 924 can clears tamper alarms or generate a "Persistent Tampering" signal, which can be transmitted to a service provider.

Figure 10:
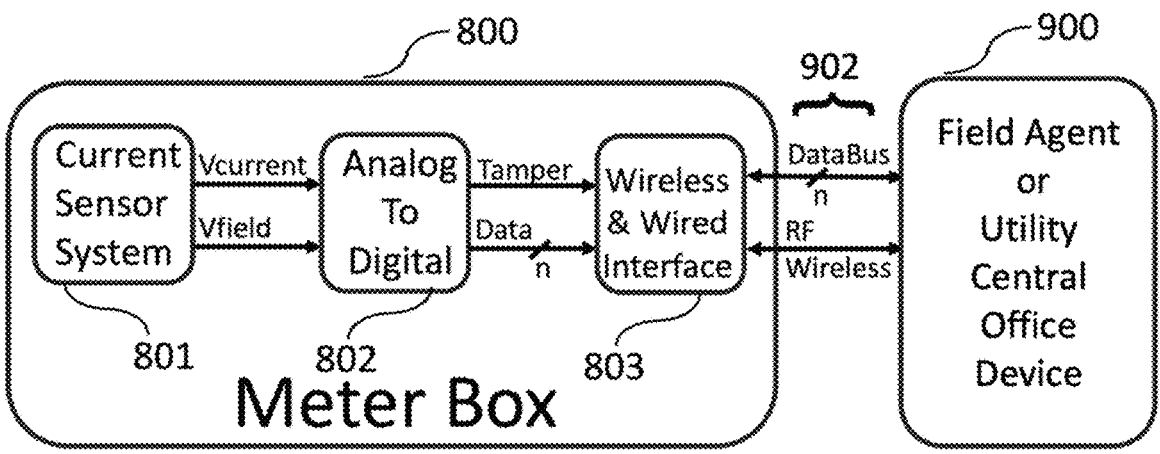
FIG. 10 shows an example implementation of an electrical meter box architecture and communication between a meter box and electrical utility provider.

FIG. 10 illustrates an example implementation of an electrical meter box architecture. Communication between a meter box 800 and electrical utility provider includes a communication link 902 between the meter box 800 and the Field Agent or Utility Central Office device 900. The communication link is preferably encrypted and has end points which are authenticated to each other at least in part using digital certificates. The communication link can be wired or wireless. In an example implementation, the meter box 800 has three main internal components: a Current Sensor System 801, an Analog to Digital Converter 802, and a Wireless or Wired Interface 803. The Current Sensor System measures the magnetic fields received by a pair of magnetic sensors and processes these measurements to determine voltages Vcurrent and Vfield which are analog voltage representations of the electrical current and the magnetic tampering field. These two voltages are converted by the Analog to Digital Converter 802 to two digital signals: "Tamper" which is an alarm that the tampering field exceeds a preset threshold, and "Data" which is a digital number representing the magnitude of the electrical current. The Wireless and Wired Interface 803 transmits data indicative of the "Tamper" and "Data" signals to either a field agent device 900, such as a handheld reading device that can be plugged into the Meter Box 900 by a field agent, or to a mobile wireless interface 900 that receives RF signals from the Meter Box 800.

Figure 11:
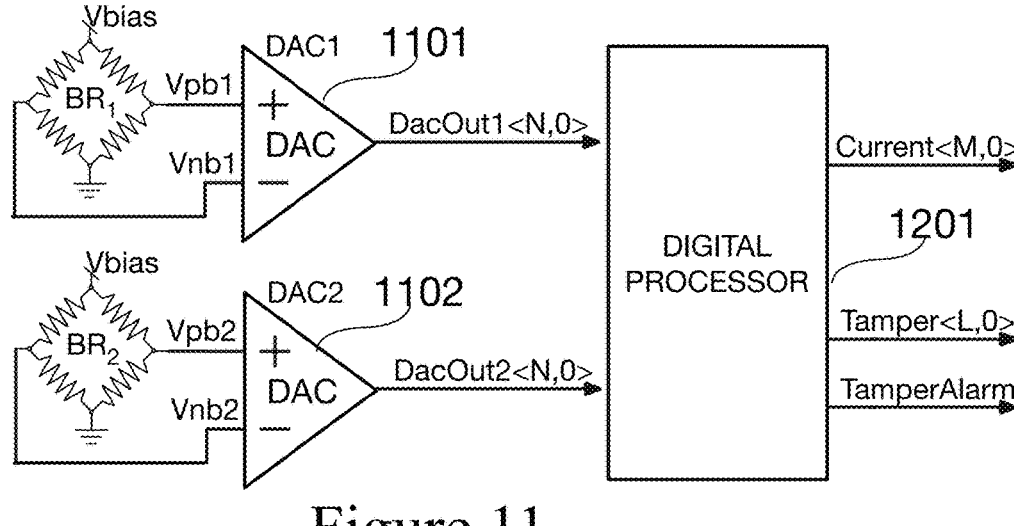
FIG. 11 is a block diagram of an example implementation of an electrical circuit using a pair analog-to-digital converters to directly convert the analog signals output by the magnetic sensors.

FIG. 11 is a block diagram of an example implementation of an electrical circuit using a pair analog-to-digital converters to directly convert the analog signals output by the magnetic sensors for further processing to generate data indicative of the magnitude of the electrical current and the magnitude of any external magnetic field. In this example implementation, all signal processing is performed by a Digital Processor 1201 which produces numerical outputs for the electrical current and the tampering field amplitudes. FIG. 11 is an implementation in which the pair of electrical voltage signals from a pair of magnetic sensors BR1 and BR2 are directly converted to digital numbers by DAC1 1101 and DAC2 1102. The pair of DAC outputs are n+1 bit digital numbers DacOut1<N,0> and DacOut2<N,0> which are processed by the Digital Processor block 1201. The digital processor block 1201 produces an M+1 bit digital signal Current<M,0> which represents the magnitude of the electrical current, and an L+1 bit digital signal Tamper<L,0> which represents the magnitude of the tampering field. It also can produce a one-bit Tamper Alarm signal if the tampering field exceeds a preset threshold.

Figure 12:
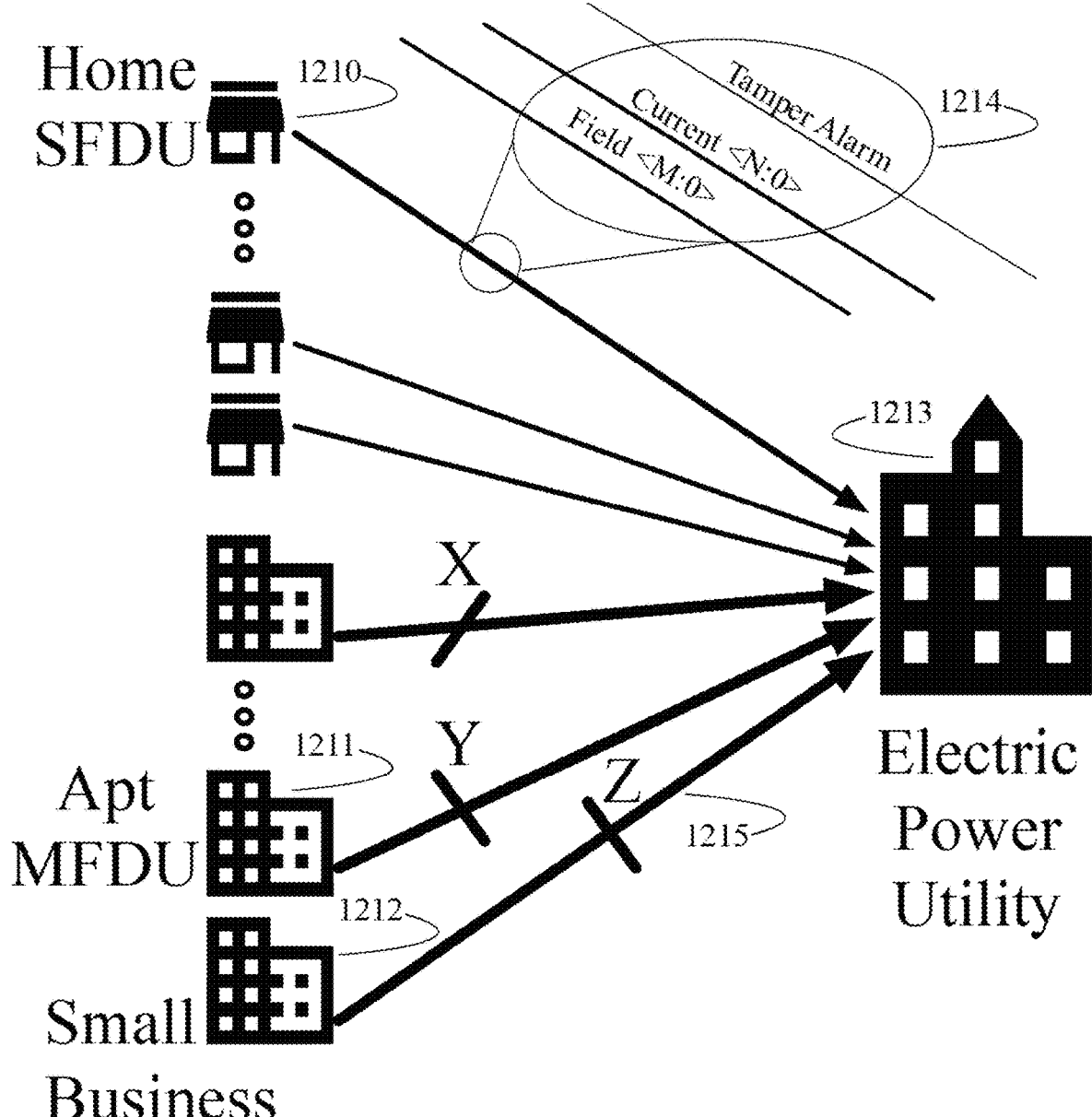
FIG. 12 is a block diagram indicating the signal connections from the electrical metering box at various multiple electrical customers which are routed to electric power utility.

FIG. 12 is a block diagram indicating the signal connections from the electrical metering box at various multiple electrical customers which are routed to electric power utility. Item 1213 represents the electric power utility. Each connection is either transmitted by a wired connection or wireless connection. Data collection for the electric power utility may also be accomplished using a roving remote connection such as a hand operated meter reader held by a person (which may be either wired or wireless) or using a roving vehicle with local wireless connectivity. Each connection is detailed in item 1214 and contains 1) a tamper alarm, 2) a vector representing an N+1 bit digital value of the electrical current, and 3) a vector representing an M+1 bit digital value of the external magnetic field. A variety of customer types are represented with a multiplicity of homes, also known as SFDU (Single Family Dwelling Units) indicated by item 1210. Item 1211 represents a MFDU (Multiple Family Dwelling Unit) such as an apartment block or condominium. Item 1212 represents a small business. The connections to MFDUs are shown with vectors marked X and Y to indicate that each unit contains a multiplicity of individual customers indicated by the notations of X and Y. One example of a collection of small businesses is indicated by the connection labeled 1215 which contains Z independent customers. All connections represented contain variations on the vector represented in item 1214. In FIG. 12, the data for the Tamper Alarm, the measured electrical current, and the external magnetic field are all transmitted to the utility for evaluation of not only the electrical usage, but also to determine whether magnetic tampering has occurred. The utility periodically evaluates this data set for each customer. Indications of possible tampering might trigger the use of more frequent evaluations of a suspect customer.

The implementations described above are only examples of several embodiments that implement the principles and techniques described herein. These embodiments include a pair of TMR sensors situated on top of a u-shaped shunt. Other embodiments include various combinations of different shunt topologies, different sensor technologies, or opposite orientation/polarity of sensor placement. For example, planar magnetic sensors and non-planar magnetic sensors can be used.

Additional implementations use the same principles as the examples described above. Such implementations generally can use any type of sensor and any topology of shunts so long as two magnetic sensors can be positioned with respect to a shunt such that one function of their signals may be used to measure the electrical current in the shunt while rejecting any external magnetic field, and another function of their signals may be used to measure the external magnetic field. In such cases, applying complementary (sum or difference) mathematical signal processing results in measure of the electrical current, on the one hand, and of the external magnetic field on the other hand. Whether the signals are differenced or summed depends on the polarity of the orientation of the sensors. These signals may be processed either in the analog voltage domain, an analog current domain, or in the digital domain after digitizing outputs of the sensors. This choice of signal processing techniques depends on the nature of the sensors, the choice of circuit architecture, and at what stage in processing the system digitizes the signals being processed.

An implementation can include any even number of sensors as long as the sensors operate in pairs that meet the orientation criteria stated above. An additional embodiment comprises any multiple of parallel shunts that meet the above criteria of using a pair of complementary sensors, but in which the multiplicity of sensors share a common signal processing arithmetic signal processor.

It should be understood that the subject matter defined in the appended claims is not necessarily limited to the specific implementations described above. The specific implementations described above are disclosed as examples only.

What is claimed is:

1. An electrical circuit, comprising:
a pair of magnetic sensors, including a first magnetic sensor configured to be placed at a first location along an electrical conductor, wherein the first magnetic sensor is responsive to at least a first magnetic field induced by an electrical current in the electrical conductor at the first location to produce a first measurement signal, and a second magnetic sensor configured to be placed at a second location along the electrical conductor where a second magnetic field induced by the electrical current and as sensed by the second magnetic sensor is complementary to the first magnetic field, and wherein the second magnetic sensor is responsive to at least a second magnetic field to produce a second measurement signal;
a first electrical circuit that processes the first measurement signal and the second measurement signal from the pair of magnetic sensors to output a first signal indicative of a measurement of the electrical current flowing through the electrical conductor;
a second electrical circuit that processes the first measurement signal and the second measurement signal from the pair of magnetic sensors to output a second signal indicative of an external magnetic field imposed upon the pair of magnetic sensors; and
a threshold circuit having a first input receiving the second signal and a second input receiving a signal indicative of a threshold and an output providing a signal indicative of tampering with the measurement of the electrical current based on the second signal and the signal indicative of the threshold.

2. The electrical circuit of claim 1, wherein the second signal is indicative of magnitude and polarity of the external magnetic field.

3. The electrical circuit of claim 1, wherein the pair of magnetic sensors and the first electrical circuit implement a dual differential current measurement which supports rejection of external magnetic fields.

4. The electrical circuit of claim 3, wherein the external magnetic field comprises at least a tampering magnetic field.

5. An electrical circuit, comprising:
a pair of magnetic sensors placed adjacent to an electrical conductor, each magnetic sensor providing a respective output signal responsive to electrical current flowing through a respective portion of the electrical conductor adjacent to the magnetic sensor;
a first electrical circuit that processes the respective output signals from the pair of magnetic signals to output a first signal indicative of the electrical current flowing through the electrical conductor;
a second electrical circuit that processes the respective output signals from the pair of magnetic signals to output a second signal indicative of magnitude and polarity of the external magnetic field imposed upon the pair of magnetic sensors; and
a comparator having a first input receiving the second signal and a second input receiving a tampering threshold and a comparison output providing a signal indicative of a comparison between the second signal and the tampering threshold.

6. An electrical utility meter for a building, comprising:
a pair of magnetic sensors placed adjacent to an electrical conductor providing a source of electrical power to the building, each magnetic sensor providing a respective output signal responsive to electrical current flowing through a respective portion of the electrical conductor adjacent to the magnetic sensor;
a first electrical circuit that processes the respective output signals from the pair of magnetic signals to output a first signal indicative of the electrical current flowing through the electrical conductor;
a second electrical circuit that processes the respective output signals from the pair of magnetic signals to output a second signal indicative of the external magnetic field imposed upon the pair of magnetic sensors;
a comparator having a first input receiving the second signal and a second input receiving a tampering threshold and a comparison output providing a signal indicative of a comparison between the second signal and the tampering threshold; and
an output circuit communicating at least a meter signal, based on the first signal, indicative of an amount of electrical power provided to the building over a period of time, and an alarm signal, based on the signal provided by the comparison output, indicative of the external magnetic field including a tampering magnetic field.

7. The electrical utility meter of claim 6, wherein the output circuit comprises a communication link from the electrical utility meter to a communication system of a utility service provider to transmit the meter signal and the alarm signal.

8. The electrical utility meter of claim 7, wherein the communication link comprises an encrypted communication link wherein the electrical utility meter and the communication system of the utility service provider are endpoints and wherein the endpoints are authenticated to each other.

9. The electrical utility meter of claim 8, wherein the endpoints are authenticated at least in part using digital certificates.

10. The electrical utility meter of claim 7, in which the output circuit is configured to transmit the meter signal or the alarm signal or both to the communication system of the utility service provider in response to a request from the communication system.

11. The electrical utility meter of claim 7, wherein the first electrical circuit is programmable such that first computer program instructions configure the first electrical circuit to process the respective output signals from the pair of magnetic sensors according to a first programmable function to generate the first output signal.

12. The electrical utility meter of claim 11, in which the output circuit is configured to change the first computer program instructions of the first electrical circuit in response to a request from the communication system.

13. The electrical utility meter of claim 6, wherein the second electrical circuit is programmable such that second computer program instructions configure the second electrical circuit to process the respective output signals from the pair of magnetic sensors according to a programmable function to generate the second signal.

14. The electrical utility meter of claim 6, wherein the output circuit is programmable such that third computer program instructions configure the output circuit to process the first signal or the second signal according to a programmable function to generate the meter signal or the alarm signal, the alarm signal indicating a metering tamper attempt originating from a strong external magnetic field.

15. The electrical utility meter of claim 14, wherein the programmable function comprises comparing the second signal to a threshold to generate the alarm signal.

16. The electrical utility meter of claim 15, wherein the programmable function comprises determining whether the external magnetic field is persistently above the threshold over time.

17. A system for measuring an electrical current in an electrical conductor while detecting presence of an external magnetic field, comprising:

means for generating a first measurement signal in response to a first magnetic field induced by an electrical current in the electrical conductor at a first location along the electrical conductor and a second measurement signal in response to a second magnetic field induced by the electrical current in the electrical conductor at a second location along the electrical conductor where the second magnetic field is complementary to the first magnetic field;

means for processing the first and second measurement signals to generate a first signal indicative of the electrical current in the conductor;

means for processing the first and second measurement signals to generate a second signal indicative of any external magnetic field;

means for comparing the second signal to a tampering threshold to generate an alarm signal indicative of whether the external magnetic field exceeds the tampering threshold, wherein the tampering threshold is indicative of an unacceptable magnetic field interference directed at the system;

means, responsive to the alarm signal, for persistently storing event information describing instances of interference directed at the system; and means for reading the persistently stored event information.

18. An electrical utility meter for a building, comprising:

a pair of magnetic sensors placed adjacent to an electrical conductor providing a source of electrical power to the building, each magnetic sensor providing a respective output signal responsive to electrical current flowing through a respective portion of the electrical conductor adjacent to the magnetic sensor;

a first electrical circuit that processes the respective output signals from the pair of magnetic signals to output a first signal indicative of the electrical current flowing through the conductor;

a second electrical circuit that processes the respective output signals from the pair of magnetic signals to output a second signal indicative of the external magnetic field imposed upon the pair of magnetic sensors; and an output circuit communicating at least a meter signal, based on the first signal, indicative of an amount of electrical power provided to the building over a period of time, and an alarm signal, based on the second signal, indicative of any detected external magnetic field, wherein the programmable function comprises comparing the second output signal to a threshold to generate the alarm signal, wherein the threshold is set to a value indicative of an external magnetic field at least two times larger than Earth's ambient magnetic field.

19. An electrical utility meter for a building, comprising:

a pair of magnetic sensors placed adjacent to an electrical conductor providing a source of electrical power to the building, each magnetic sensor providing a respective output signal responsive to electrical current flowing through a respective portion of the electrical conductor adjacent to the magnetic sensor;

a first electrical circuit that processes the respective output signals from the pair of magnetic signals to output a first signal indicative of the electrical current flowing through the electrical conductor;

a second electrical circuit that processes the respective output signals from the pair of magnetic signals to output a second signal indicative of the external magnetic field imposed upon the pair of magnetic sensors; and an output circuit communicating at least a meter signal, based on the first signal, indicative of an amount of electrical power provided to the building over a period of time, and an alarm signal, based on the second signal, indicative of any detected external magnetic field, wherein the programmable function comprises comparing the second output signal to a threshold to generate the alarm signal, wherein the threshold is set to a value indicative of an external magnetic field between Earth's magnetic field and a value at which the pair of magnetic sensors are subject to either saturation or damage.

20. An electrical utility meter for a building, comprising:

a pair of magnetic sensors placed adjacent to an electrical conductor providing a source of electrical power to the building, each magnetic sensor providing a respective output signal responsive to electrical current flowing through a respective portion of the electrical conductor adjacent to the magnetic sensor;

a first electrical circuit that processes the respective output signals from the pair of magnetic signals to output a first signal indicative of the electrical current flowing through the electrical conductor;

a second electrical circuit that processes the respective output signals from the pair of magnetic signals to output a second signal indicative of the external magnetic field imposed upon the pair of magnetic sensors; and an output circuit communicating at least a meter signal, based on the first signal, indicative of an amount of electrical power provided to the building over a period of time, and an alarm signal, based on the second signal, indicative of any detected external magnetic field, wherein the external magnetic field comprises a tampering field greater than an ambient magnetic field due to Earth's magnetic field and any additional ambient magnetic field produced by electrical circuitry operating in proximity to the magnetic sensors.

* * * * *